(12) United States Patent
Hunt et al.

(10) Patent No.: US 10,444,883 B2
(45) Date of Patent: Oct. 15, 2019

(54) TOUCH SCREEN DISPLAY INCLUDING TOPOLOGICAL INSULATORS

(71) Applicant: The Boeing Company, Chicago, IL (US)

(72) Inventors: Jeffrey H. Hunt, Thousand Oaks, CA (US); Angela W. Li, Everett, WA (US); Wayne R. Howe, Irvine, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/849,513

(22) Filed: Dec. 20, 2017

(65) Prior Publication Data

US 2019/0146617 A1 May 16, 2019

Related U.S. Application Data

(63) Continuation-in-part of application No. 15/815,584, filed on Nov. 16, 2017.

(51) Int. Cl.
| | |
|---|---|
| *G06F 3/041* | (2006.01) |
| *G06F 3/042* | (2006.01) |

(Continued)

(52) U.S. Cl.
CPC ............ *G06F 3/0412* (2013.01); *G06F 3/041* (2013.01); *G06F 3/042* (2013.01); *G06F 3/045* (2013.01); *H01B 5/14* (2013.01); *H01B 17/005* (2013.01); *H01L 21/477* (2013.01); *G06F 3/044* (2013.01); *G06F 3/0416* (2013.01); *G06F 2203/04103* (2013.01); *G06F 2203/04112* (2013.01);

(Continued)

(58) Field of Classification Search
None
See application file for complete search history.

(56) References Cited

U.S. PATENT DOCUMENTS

| | | |
|---|---|---|
| 5,508,489 A | 4/1996 | Benda et al. |
| 6,815,636 B2 | 11/2004 | Chung et al. |

(Continued)

FOREIGN PATENT DOCUMENTS

WO   WO 2013/086227 A1   6/2013

OTHER PUBLICATIONS

Ando et al., "Topological Insulator Materials," Journal of the Physical Society of Japan, Invited Review Papers, 2013, pp. 1-36.

(Continued)

*Primary Examiner* — Brian M Butcher
(74) *Attorney, Agent, or Firm* — MH2 Technology Law Group LLP

(57) ABSTRACT

Various methods and devices for touch screens using topological insulators are provided. One of the touch screen devices includes a touch sensor layer including a three-dimensional "3D" topological insulator that maintains an electric charge over opposing outer surfaces of the 3D topological insulator. The touch screen device also includes electrodes electrically connecting the opposing outer surfaces of the 3D topological insulator. The touch screen device also includes a controller that determines a position at which an object touches the touch screen device based on a change in the electric charge over the opposing outer surfaces.

15 Claims, 6 Drawing Sheets

(51) Int. Cl.
    H01B 17/00      (2006.01)
    G06F 3/045      (2006.01)
    H01B 5/14       (2006.01)
    H01L 21/477     (2006.01)
    G06F 3/044      (2006.01)

(52) U.S. Cl.
    CPC ............... G09G 2300/0421 (2013.01); G09G 2300/0426 (2013.01)

(56) References Cited

U.S. PATENT DOCUMENTS

| | | | |
|---|---|---|---|
| 7,515,986 | B2 | 4/2009 | Huskamp |
| 9,296,007 | B2 | 3/2016 | Li et al. |
| 9,630,209 | B2 | 4/2017 | Hunt et al. |
| 9,632,542 | B2 | 4/2017 | Li et al. |
| 9,732,418 | B2 | 8/2017 | Li et al. |
| 2010/0140723 | A1 | 6/2010 | Kurtz et al. |
| 2011/0279408 | A1* | 11/2011 | Urano ............... G06F 3/044 345/174 |
| 2014/0199542 | A1 | 7/2014 | Li et al. |
| 2015/0165556 | A1 | 6/2015 | Jones et al. |
| 2015/0174695 | A1 | 6/2015 | Elfstroem et al. |
| 2015/0255184 | A1 | 9/2015 | Li et al. |
| 2015/0257308 | A1 | 9/2015 | Li et al. |
| 2016/0082617 | A1 | 3/2016 | Howe et al. |
| 2016/0116679 | A1 | 4/2016 | Muendel et al. |
| 2016/0158889 | A1 | 6/2016 | Carter et al. |
| 2016/0168692 | A1 | 6/2016 | Li et al. |
| 2017/0090119 | A1 | 3/2017 | Logan et al. |
| 2017/0173737 | A1 | 6/2017 | Gray |
| 2017/0306476 | A1 | 10/2017 | Li et al. |

OTHER PUBLICATIONS

Hasan et al., "Colloquium: Topological Insulators," The Amer. Phys. Soc., Reviews of Modern Physics, vol. 82, Oct.-Dec. 2010, pp. 3045-3067.
Hills et al., "From Graphene and Topological Insulators to Weyl Semimetals," WSPC/Instruction File, 2015, pp. 1-33.
HLA, "Single Atom Extraction by Scanning Tunneling Microscope Tip-Crash and Nanoscale Surface Engineering," Nanoscale & Quantum Phenomena Institute, Physics & Astronomy Department. Ohio University, Athens, OH, date unknown, pp. 1-15.
HLA, "STM Single Atom/Moledule Manipulation and Its Application to Nanoscience and Technology," Critical Review article, J. Vac. Sci. Tech, 2005, pp. 1-12.
Khanikaev et al., Photonic Topological Insulators, Nature Materials, vol. 12, Mar. 2013, pp. 233-239.
Kong et al., "Opportunities in Chemistry and Materials Science for Topological Insulators and Their Nanostructures," Nature Chemistry, vol. 3, Nov. 2011, pp. 845-849.
Kuzmenko et al., Universal Dynamical Conductance in Graphite, *DPMC, University of Geneva*, Switzerland, 2007, pp. 1-5.
Li et al., "Marginal Topological Properties of Graphene; a Comparison with Topological Insulators," *DPMC, University of Geneva*, Switzerland, 2012, pp. 1-9.
Mak et al., "Optical Speotroscopy of Graphene: From the Far Infrared to the Ultraviolet," Solid State Communications, 152 (2012), 1341-1349.
Mingareev et al., "Laser Additive Manufacturing Going Mainstream," Optics and Photonics News, Feb. 2017, 8 pages.
Moore, "The Birth of Topological Insulators," Nature, vol. 464, Insight Perspective (2010), pp. 194-198.
Peng et al., "Topological Insulator Nanostructures for Near-Infrared Transparent Flexible Electrodes," Nature Chemistry, vol. 4, Apr. 2012, pp. 281-286.
Qi et all, "Topological insulators and Superconductors," arXiv:1008.2026v1 [cond-mat.mes-hall], (2010), pp. 1-54.
Zhang, "Viewpoint: Topological States of Quantum Matter," American Physical Society, Physics 1. 6 (2008), 3 pages.
Zhu et al., "Optical Transmittal of Multilayer Graphene," EPL, 106 (2014) 17007, 4 pages.
Gu, "Chapter 2—Laser Additive Manufacturing (AM): Classification, Processing Philosophy, and Metallurgical Mechanisms," Laser Additive Manufacturing of High-Performance Materials, 2015, XVII, pp. 15-24.
Wikipeda, Graphene, https://en.widipedia.org/wiki/Graphene, 29 pages, downloaded Nov. 15, 2017.
Wikipedia, Scanning Tunneling Microscope, https://en.wikipedia.org/wiki/Scanning_Tunneling_Microscope, 9 pages.
Wikipedia, "Nanometer," http://en.wikipedia.org/wiki/Nanometre, 2 pages.
Wikipedia, "Carbon Nanotubes," https://en.wikipedia.org/wiki/Carbon_Nanotube, 22 pages.

* cited by examiner

TOUCH SCREEN DISPLAY INCLUDING TOPOLOGICAL INSULATORS

BACKGROUND

A touch screen is a computer display and control device that can be operated by touching a display area using, for example, a finger or a stylus. Because use of touch screen devices involves direct physical contact, undesirable substances (e.g., moisture, dirt, dust, oils, etc.) can be transferred to the surface of a touch screen. These substances can damage (e.g., scratch and/or abrade) the touch screen and/or reduce the ability of the touch screen to accurately detect the location of the physical contact. To address this problem, touch screens include protective coatings. However, protective coatings can also reduce performance. For example, they may reduce the optical transparency of a touch screen and/or reduce its sensitivity to inputs. Therefore, it would be desirable to provide touch screens and coatings for touch screens that overcome the above limitations.

SUMMARY

Implementations disclosed herein provide various touch screen devices using topological insulators. The touch screen devices can include a touch sensor layer including a three-dimensional ("3D") topological insulator that maintains an electric charge over opposing outer surfaces of the 3D topological insulator. The touch screen device also includes electrodes electrically connected the opposing outer surfaces of the 3D topological insulator. The touch screen device also includes a controller that determines a position at which an object touches the touch screen device based on a change in the electric charge over the opposing outer surfaces.

Implementations disclosed herein also provide methods of making touch screen devices. The methods can include forming a 3D topological insulator layer having a first electrically conductive surface, a second electrically conductive surface, and a dielectric interior. The methods can also include electrically connecting electrodes to the first electrically conductive surface.

BRIEF DESCRIPTION OF THE FIGURES

The present disclosure will become more fully understood from the detailed description and the accompanying drawings, wherein.

DETAILED DESCRIPTION

Figure 1:
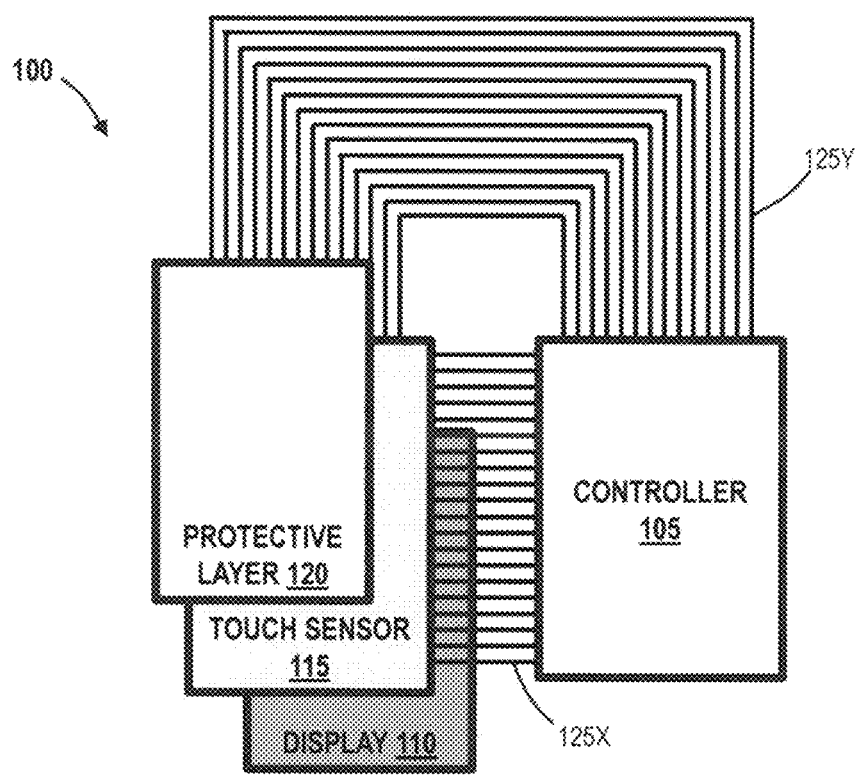
FIG. 1 shows a functional block diagram illustrating an example of a touch screen display device in accordance with aspects of the present disclosure.

This disclosure relates to computer display devices and, more specifically, touch screen display devices. In accordance with aspects of the present disclosure, topological insulator layers are used to provide a touch screen sensors and/or protective layers.

Individual atoms have quantized discrete energy levels which are occupied by each individual atom's electrons. In the case of a solid, however, many atoms are in close proximity to one another and the discrete energy levels of the individual atoms combine to form so-called "energy bands." These energy bands are defined by energies that can be determined by spectroscopically measuring the bandgap in the solid, for example, according to known spectroscopic methods, such as wavelength modulation spectroscopy. Generally, photons having energy values that lie below the bandgap will transmit through the solid while photons having energy values at or above the bandgap will be strongly absorbed. In wavelength modulation spectroscopy, the relative absorption of the photons is correlated with the band density of states.

The energy bands describe electron behavior within the solid. For example, in these energy bands, electron energy can be described as a function of the electron's wave-vector as the electron travels through the solid. Macroscopic behavior of many electrons in the solid—electrical conductivity, thermal conductivity, and the like—result from the hand structure. Ordinarily, the geometric construction of solids do not have an effect on the band structure. However, for very thin solids such as graphene, not only does the solid's geometry change, but so too does its band structure. That is, for thin solids, the electron behavior changes as the geometry of the solid changes. Thus, whether a solid is a defined as a "2D" or "3D" structure depends on the solid's band structure. For example, graphene is monoatomic and its 2D band structure only exists when it is one atomic layer thick. The addition of more atomic layers (i.e., from single-layer graphene to few-layer graphene) not only increases graphene's thickness, but also changes its band structure toward its 3D configuration (i.e., graphite).

A topological insulator is a special type of material with a non-trivial topological order. At a quantum mechanical level, surface stales of electrons in topological insulators are symmetry-protected by particle number conservation and time-reversal symmetry. In the bulk of a topological insulator, the electronic band structure resembles an ordinary band insulator, with the Fermi level falling between the conduction and valence bands. However, on the surface of a topological insulator there are special states that fall within the bulk energy gap and allow surface metallic conduction. Carriers in these surface states have their spin locked at a right-angle to their momentum (i.e., spin-momentum locking). At a given energy the only other available electronic states have different spin, such that U-turn scattering is strongly suppressed and conduction on the surface is highly metallic. As a result, topological insulators structures (e.g., a layer or tube of topological insulator) behave as insulators in their interiors, and behave as conductors on their outermost surfaces.

Topological insulator materials can include several different atoms and can be molecularly engineered. Thus, unlike graphene, which faces the aforementioned issues to changes in its band structure, a topological insulator largely maintains its 2D band structure even as the material's thickness is changed.

In accordance with aspects of the present disclosure, one or more topological insulator structures are used in a touch screen device. In implementations, the topological insulator structures can be used as a protective coating for the touch screen device and/or for a component of a touch sensor. For example, by applying their novel physical properties, a single transparent topological insulator layer can function as both an electrically conductive surface and as a dielectric layer. Accordingly, touch screen displays consistent with those disclosed herein may have an outermost surface that lacks any electrically conductive coating overlaying the outermost surface.

Any topological insulator not inconsistent with the objectives of the present disclosure may be used in the implementations disclosed herein. For example, while not intended to be limited to any specific implementation, and for reference purposes herein, a "topological insulator" means a two-dimensional ("2D") or three-dimensional ("3") material with time-reversal symmetry and topologically protected edge states (2D) or surface states (3D). For example, a 2D topological insulator generally will not conduct current across the surface of the 2D material, but can carry current along the edges of the 2D material. In another example, a 3D topological insulator generally will not conduct current through the bulk of the 3D material, but can carry current along the surface of the 3D material. In implementations, the topological insulator can be a non-carbon-based topological insulator. As used herein, the term "non-carbon-based topological insulator" or "non-carbon-based topological insulator" means a topological insulator whose crystal structure does not include carbon. Some non-carbon-based topological insulators can comprise, consist essentially of, or consist of, for example, one or more of antimony (Sb), bismuth (Bi), selenium (Se), or tellurium (Te), or combinations thereof.

Topological insulators described herein, such as for example, the non-carbon based topological insulators described herein, can comprise, consist essentially of, or consist of, but are not limited to, one or more of $Bi_{1-x}Sb_x$ (0<x<1) (e.g., $Bi_{0.9}Sb_{0.1}$), $Bi_{1-x}Te_x$ (0<x<1), $Bi_{t-x}Te_x$ (0<x<1), Sb, $Bi_2Se_3$, $Bi_2Te_3$, $Sb_2Te_3$, $Bi_2Te_2Se$, $(Bi,Sb)_2Te_3$ (e.g., $Bi_{0.2}Sb_{0.8})_2Te_3$, $Bi_{2-x}Sb_xTe_{3-y}Se_y$ (0≤x≤2; 0≤y≤3), $Bi_{2-x}Sb_xTe_{3-y}Se_y$(0≤x≤2; 1≤y≤3) (e.g., $Bi_2Te_{1.95}Se_{1.05}$, $BiSbTe_{1.25}Se_{1.75}$), $Bi_2Te_{1.6}S_{1.4}$, $Bi_{1.1}Sb_{0.9}Te_2S$, $Sb_2Te_2Se$, $Bi_2(Te,Se)_2(Se,S)$, $TlBiSe_2$, $TlBiSe_2$, $TlBi(S_{1-x},Se_x)_2$ (0.5≤x≤1), $Pb(Bi_{1-x}Sb_x)_2Te_4$, (0≤x≤1), $PbBi_2Te_4$, $PbSb_2Te_4$, $PbBi_4Te_7$, $GeBi_2Te_4$, $GeBi_{4-x}Sb_xTe_7$ (0≤x≤4), $(PbSe)_5(Bi_2Se_3)_3$, $(PbSe)_5(Bi_2Se_3)_6$, $(Bi_2)(Bi_2Se_{2.6}S_{0.4})$, $Bi_4Se_3$, $Bi_4Se_{2.6}S_{0.4}$, $(Bi_2)(Bi_2Te_3)_2$, SnTe, $Pb_{1-x}Sn_xSe$ (0<x<1), $Pb_{1-x}Sn_xTe$ (0<x<1), $Pb_{0.77}Sn_{0.23}Se$, $Bi_{1.84-x}Fe_{0.16}Ca_xSe_3$ (0≤x<1.84), $Cr_{0.08}(Bi_{0.1}Sb_{0.9})_{1.92}Te_3$, $(Dy_xBi_{1-x})_2Te_3$ (0<x<1), $Ni_xBi_{2-x}Se_3$ (0<x<2), $(Ho_xBi_{1-x})_2Se_3$ (0≤x<1), $Ag_2Te$, $SmB_6$, $Bi_{14}Rh_3I_9$, $Bi_{2-x}Ca_xSe_3$ (0<x<2), $Bi_{2-x}Mn_xTe_3$ (0<x<2) (e.g., $Bi_{1.96}Mn_{0.04}Te_3$, $Bi_{1.96}Mn_{0.04}Te_3$, $Bi_{1.98}Mn_{0.02}Te_3$), $Ba_2BiBrO_6$, $Ba_2BiIO_6$, $Ca_2BiBrO_6$, $Ca_2BiIO_6$, $Sr_2BiBrO_6$, or $Sr_2BiIO_6$, or combinations thereof.

Topological insulator layers described herein can have selected optical transmittance. As used herein, the term "optical transmittance" means the fraction of incident electromagnetic power that is transmitted through a substance, mixture, or material. The selected optical transmittance can provide improved optical properties, such as improved optical clarity. Improved transmittance, and/or improved protection from ultraviolet radiation. One or more dopants can be used to tune one or more of the topological insulators of the one or more layers of the topological insulator layers in order to achieve desired optical transmittance, as understood by one of ordinary skill in the art.

One or more dopants can be used to tune the topological insulator layers in order to achieve these levels of optical transmittance, thermal conductivity, electrical conductivity, and/or electrical resistivity as understood by one of ordinary skill in the art. The doping can comprise, for example, interstitial doping of a crystal structure of at least one 2D or 3D, topological insulator layers. Such doping can break the time-reversal symmetry of the at least one 2D or 3D topological insulator layers. Potential dopants described herein include, for example, semiconductors, rare earth elements, transition metals, and/or other elements. Such semiconductors can include, for example, germanium ("Ge"), silicon ("Si"), and silicon-germanium alloys (e.g., $Si_{1-x}Ge_x$ (0<x<1)). Such rare earth elements can include, for example, cerium "Ce"), dysprosium ("Dy"), erbium ("ER"), europium ("Eu"), gadolinium ("Gd"), holmium ("Ho"), lanthanum ("La"), lutetium ("Lu"), neodymium ("Nd"), praseodymium ("Pr"), promethium ("Pm"), samarium ("Sm") , scandium ("Sc"), terbium ("Tb"), thulium ("Tm"), ytterbium ("Yb"), and yttrium ("Y"). Such transition metals can include, for example, bohrium ("Bh"), cadmium ("Cd"), chromium ("Cr"), cobalt ("Co"), copernicium ("Cn"), copper ("Cu"), darmstadtium ("Ds"), dubnium ("Db"), gold ("Au"), hafnium ("Hf"), hassium ("Hs"), iridium ("Ir"), iron ("Fe"), manganese ("Mn"), meitnerium ("Mt"), mercury ("Hg"), molybdenum ("Mo"), nickel ("Ni"), niobium ("Nb"), osmium ("Os"), palladium ("Pd"), platinum ("Pt"), rhenium ("Re"), rhodium ("Rh"), roentgenium ("Rg"), ruthenium ("Ru"), rutherfordium ("Rf"), seaborgium ("Sg"), silver ("Ag"), tantalum ("Ta"), technetium ("Te"), titanium ("Ti") tungsten ("W"), vanadium ("V"), zinc ("Zn"), and zirconium ("Zr"). Such other elements can include, for example, antimony ("Sb"), calcium ("Ca"), magnesium ("Mg"), oxygen ("O"), strontium ("Sr"), tin ("Sn"), and combinations thereof.

FIG. 1 illustrates a functional block diagram of a touch screen display device 100 in accordance with aspects of the present disclosure. The touch screen display device 100 can include a touch screen controller 105, a display layer 110, a touch sensor layer 115, and a protective layer 120. While FIG. 1 illustrates the display layer 110, the touch sensor layer 115, and the protective layer 120 as offset from one another for the sake of illustration, one or ordinary skill in the art will understand that the display layer 110, the touch sensor layer 115, and the protective layer 120 would stacked so as to directly overlaid in substantially vertical alignment with one another without any substantial offset. In implementations, the display layer 110, the touch sensor layer 115, and the protective layer 120 are direct contact. In other implementations, the display layer 110, the touch sensor layer 113, and/or the protective layer 120 may be separated by an intervening layer, such as an adhesive layer.

The controller 105 can be a device electrically connected to the touch screen sensor 115 by signal lines 123X and signal lines 125Y via electrodes (shown in FIG. 2) of the touch sensor layer 115. The electrodes connected to signal lines 125Y can be substantially perpendicular to the electrodes connected to signal lines 125X so as to provide an array or matrix that can be used to detect the locations of touch inputs. For example, the controller 105 can include circuitry that provides excitation currents to the electrodes of the touch sensor layer 115 using the signal lines 125X, and circuitry that detects signals induced on the electrodes of the touch sensor layer 115 in response to a touch input using the signal lines 125Y. Further, the controller 105 can include hardware logic and/or software that determines the particular location of the touch input based on the signals induced on the electrodes of the touch sensor layer 115.

The display layer 110 can be, for example, a cathode ray tube ("CRT") display, a liquid-crystal display ("LCD"), a light-emitting diode ("LED") display or organic-LED ("OLED") display. The touch sensor layer 115 can be a resistive sensor, a surface capacitive sensor, a projected capacitive touch (PCT) sensor, a surface acoustic waves (SAW) sensor, an infrared grid sensor, an infrared acrylic projection sensor, an optical imaging sensor, a dispersive signal technology sensor, or an acoustic pulse recognition sensor. In cases where the touch sensor layer 115 is a surface capacitive touch screen sensor, the touch screen sensor 115 can be a mutual capacitance or a self-capacitance touch screen. In addition, the touch sensor layer 115 can be a single-touch or a multi-touch touch screen sensor.

In accordance with aspects of the present disclosure, the touch sensor layer 115 exhibits high optical transmittance, particularly within the visible region of the electromagnetic spectrum. In some implementations, the touch sensor layer 115 (and/or the components included therein) has a thickness of greater than or equal to 20 nanometers (nm) and exhibits an optical transmittance of at least about 90 percent or at least about 95 percent between wavelengths of about 350 nanometers ("nm") and about 750 nm. In some implementations, the touch sensor layer 115 has thickness of between about 10 nm and 20 nm and exhibits an optical transmittance of at least about 98 percent between about 350 nm and about 750 nm.

The protective layer 120 can be a substantially transparent layer that provides mechanical or chemical protection to the touch sensor layer 115 and/or other components of the touch screen display device 100. In some implementations, the protective layer 120 can be for example, a substantially transparent glass, polycarbonate, or polymer (e.g., an acrylate such as poly(methyl methacrylate), a polyurethane, and a polyethylene). In some implementations, the protective layer 120 can be an inorganic material such as an inorganic oxide. In some implementations, the protective layer can be silica or quartz glass. Additionally, in some implementations, the protective layer 120 can be a composite material such as particulate or fiber-shaped inorganic material dispersed in an organic material. For example, the composite material can be fiberglass disposed in an organic polymer matrix.

Some implementations of the protective layer 120 can have a thickness between about 100 nm and about 1 mm, between about 100 nm and about 10 micrometers ("μm"), or between about 500 nm and about 5 μm. In some implementations, the protective layer 120 can have a thickness greater than about 1 mm. It is understood that the material and/or thickness used for the protective layer 120 can be selected based on the type of touch screen. For example, in some implementations, a flexible polymer or a flexible glass layer can be used for a resistive touch screen structure, whereas a rigid or non-flexible glass layer can be used for a surface capacitive touch screen structure.

Figure 2:
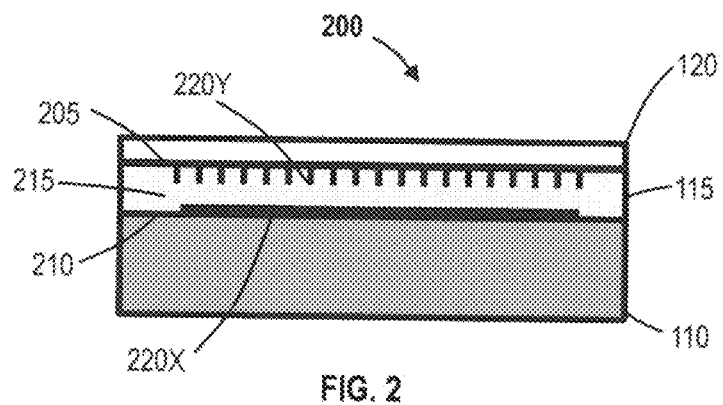
FIG. 2 shows a cross sectional view illustrating an example of a touch screen display device in accordance with aspects of the present disclosure.

FIG. 2 illustrates a cross sectional view of a touch screen display device 200 in accordance with aspects of the present disclosure. The touch screen display device 200 can include a display layer 110, a touch sensor layer 115, and a protective layer 120, which can be the same or similar to those previously described herein. In accordance with aspects of the present disclosure, the touch sensor layer 115 can include a 3D topological insulator layer 203, a top non-conductive layer 205, and a bottom non-conductive layer 210. In some implementations, the 3D topological insulator layer 203 can be a single bulk layer material solely comprised of a 3D topological insulator. In other implementations, the 3D topological insulator layer 203 can be a bulk material doped with another material (e.g., silicon (Si) or germanium (Ge)) that improves electrical characteristics, such as conductance and/or resistivity. As described previously, the 3D topological insulator layer 203 has conductive outer surfaces and a non-conductive (e.g., a dielectric) interior 204. Accordingly, a differential electric charge can be established and maintained on the conductive outer surfaces 204X and 204Y across the dielectric interior 204Z of the 3D topological insulator 203. In implementations, the opposing outer surfaces of the 3D topological insulator layer 203 can be the upper, substantially planar surface 204Y and a lower planar surface 204X. The differential electric charge can be provided across opposing outer surfaces 204X and 204Y of the 3D topological insulator layer 203 by electrodes 220X and 220Y arranged on opposing sides of the 3D topological insulator layer 203.

The top non-conductive layer 205 can be overlaid on top of the 3D topological insulator layer 203 and can include electrically conductive electrodes 220Y. The bottom non-conductive layer 210 can be underlaid below the 3D topological insulator layer 203 and can include electrically conductive electrodes 220X. The electrodes 220Y can be substantially parallel signal lines that are electrically isolated from one another by dielectric material comprising the top non-conductive layer 205. The electrodes 220X can be substantially parallel signal lines that electrically isolated from one another by a dielectric material comprising the bottom non-conductive layer 210. While the top non-conductive layer 205 and the bottom non-conductive layer 210 are described above as being in the touch sensor layer 115, it is understood that in some implementations these layers and/or their functionality can be implemented as layers that are separate from the touch sensor layer 115. Additionally, in some implementations, the top non-conductive layer 203 can be part of the protective layer 120 and/or the bottom non-conductive layer 210 can be part of the display layer 110. For example, the electrodes 220X, 220Y can be embedded in the protective layer 120 and the displayer layer 110.

In some implementations, the bottom non-conductive layer 210 of the touch sensor layer 115 is overlaid in direct physical contact with the display layer 110. For example, the touch sensor layer 115 can be mechanically held (e.g., clamped) onto the display layer 110. In some implementations, the touch sensor layer 115 can be attached to the display layer 110 using an adhesive or by bonding. The adhesive can be, for example, a silicone, an epoxy, a urethane, an acrylic, a tape, a film, a foil, or solder material. The bonding can be, for example, covalent bonding, ionic bonding, hydrogen bonding, electrostatic interactions, and van der Waals interactions. Additionally, in some implementations, the top non-conductive layer 205 of the touch sensor layer 115 can be overlaid in direct physical contact with the protective layer 120. For example, the top non-conductive layer 205 of the sensor layer 115 can be directly attached to the protective layer 120 mechanically or by an adhesive, such as described above.

The touch sensor layer 115 can include or be attached to electrodes 220X, which are electrically connected to a controller (e.g. controller 105 using signal lines 125X), electrodes 220Y, which can be electrically connected to the controller (e.g., controller 105 using signal lines 125Y). In some implementations, the electrodes 220X and 220Y can be arranged with respect to one another to form a grid, mesh, or array pattern. The electrodes 220X and 220Y can be a metal or metal alloy, such as indium, gold, silver, copper, or a combination thereof. The electrodes 220X and 220Y can also be formed from non-metals, such as transparent conducting oxides or conducting polymers. Advantageously, in implementations in which the touch sensor layer 115 is formed using a sole 3D topological insulator layer 203, touch input signals can be induced on the electrodes 220X and 220Y across the sole 3D topological insulator layer 203. Thereby, a controller (e.g., controller 105) can determine a position at which an object touches the touch screen display device 200 based on a change in the electric charge over the top non-conductive layer 205.

Figure 3:
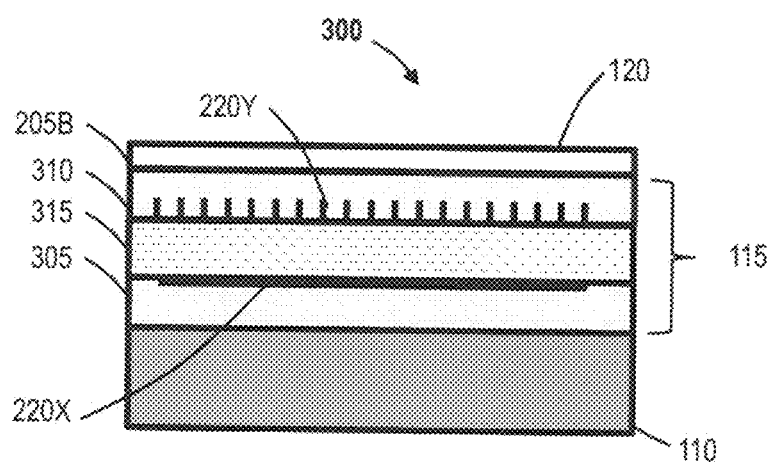
FIG. 3 shows a cross sectional view illustrating an example of a touch screen display device in accordance with aspects of the present disclosure.

FIG. 3 illustrates a cross sectional view of a touch screen display device 300 in accordance with aspects of the present disclosure. The touch screen display device 300 can include a display layer 110, a touch sensor layer 115, and a protective layer 120. The display layer 110 and the protective layer 120 can be the same or similar to those previously described herein. In accordance with aspects of the present disclosure, the touch sensor layer 115 can include a first non-conductive layer 305 directly underlying of a second non-conductive layer 310 and separated from the second non-conductive layer 310 by a spacer layer 315. In addition, the first non-conductive layer 305 electrically isolate electrodes 220X from one another and the second non-conductive layer 310 can electrically isolate electrodes 220Y from one another in a manner similar to that described above.

One or both sets of electrodes 220X and 220Y can be a 3D topological insulator, such as that previously described, to other implementations, one of electrodes 220X and 220Y is a substantially transparent conducting oxide (TCO), such as indium tin oxide (ITO) fluorine doped tin oxide (FTO), or doped zinc oxide. In other implementations, the one of the electrodes 220X and 220Y can be a graphene layer, or a 2D topological layer or film. Accordingly, a differential electric charge can be established and maintained on 220X and 220Y across the spacer layer 315 in a similar manner to that previously described herein.

The spacer layer 315 can be a dielectric layer separating the non-conductive layers 305 and 310, and separating electrodes 220X and 220Y. In some implementations, for example, the spacer layer 315 can be an air gap or a substantially empty space. In other implementations, the spacer layer 315 is a flexible or deformable support structure, such as an array of microdots disposed between the electrically conductive layers. In some implementations, the spacer layer 315 can be a non-conductive adhesive. In some implementations, the spacer layer 315 has a thickness between about 10 nm and about 1000 µm, between about 100 nm and about 500 µm, or between about 500 nm and about 5 µm. In some implementations, the spacer layer 315 can have a thickness greater than about 1 mm or less than about 10 nm.

As illustrated in FIG. 3, the electrodes 220X and 220Y are aligned in direct opposition to one another and are separated by the spacer layer 315. Thus, in some implementations, the touch screen display device 300 can be a resistive touch screen that operates by contacting the electrodes 220X and 220Y through or within the spacer layer 315. For example, particular portions of the electrodes 220X and 220Y can contact when the electrodes 220Y are deformed by pressure applied by a user's finger or stylus on the surface of the touch screen display device 300. Additionally, the above-described arrangement of the electrodes 220X and 220Y can be used to provide a surface capacitive touch screen.

While FIGS. 1-3 illustrate a protective layer 120, it is understood that implementations of the touch screen display devices 100, 200, and 300 can exclude the protective layer 130. Rather, the upper surface of the touch sensor layer 115 (e.g., which can be a topological insulator or graphene) can provide mechanical or chemical protection to the components of the touch screen display devices 100, 200, and 300.

Figure 4:
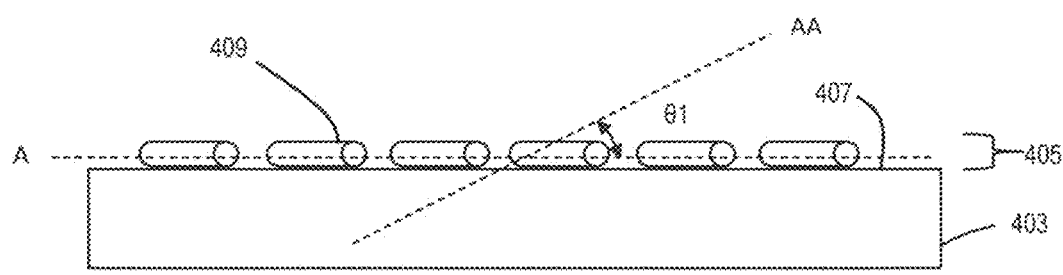
FIG. 4 shows a cross sectional view illustrating an example of an electrically conductive layer in accordance with aspects of the present disclosure.

FIG. 4 illustrates a cross sectional view of an electrically conductive layer 400 for a touch screen sensor (e.g. touch sensor layer 115 of FIGS. 1-3) in accordance with aspects of the present disclosure. The electrically conductive layer 400 can include a substrate layer 403 and a 3D topological insulator layer 405 disposed on a surface 407 of the substrate layer 403. In implementations, the substrate layer 403 can be an inorganic material such as an inorganic oxide or inorganic glass such as soda glass. In some implementations, the substrate layer 403 is formed from an aluminum oxide, such as sapphire. In some implementations, the substrate layer 403 is formed from silica or quartz, including fused quartz. In some implementations, the substrate layer 403 is formed from one or more of optical glass (e.g., BK7 crown glass), fused quartz, and fused silica. In other implementations, the substrate layer 403 is formed from an organic material such as an insulating polymer. In some implementations, the substrate layer 403 includes or is formed from a polyester, poly(ethylene terephthalate) (PET), polycarbonate, or combination thereof.

The 3D topological insulator layer 405 can include a number of topological insulator layer tubes 409 oriented horizontally or substantially horizontally on the surface 407 of the substrate layer 403. The orientation of the topological insulator layer tubes 409 can be used to optimize electrical resistivity (e.g., piezoresistance) of the touch screen sensor. In some implementations, the horizontal topological insulator layer tubes 409 can be used to provide conductive signal lines (e.g., signal lines 125) lines providing an array or matrix of a touch sensory (e.g., touch sensor 115) that can be used to detect the locations of touch inputs. The topological insulator layer tubes 409 can be formed in various ways, including deposition (e.g., chemical vapor deposition), chemical processes (e.g., where the substrate layer 403 includes elements, such as hydrogen or sodium attached to the edge, which causes a flat topological insulator layer to form the tubes) or mechanically (e.g., by use of electric fields applied to the flat topological insulator layer, causing it to roll over onto itself).

The horizontal orientation of the layer tubes 409 is relative to the surface 407 of the substrate layer 403, wherein the "horizontal" orientation is along axis A of a topological insulator layer tube 409 oriented parallel to the surface 407. As illustrated in FIG. 4, all of the topological insulator layer tubes 409 are depicted as having a long axis oriented parallel to the surface 407. However, other arrangements are possible. For example, in some implementations, one or more topological insulator layer tubes 409 can have a long axis along line AA or along some other direction that is not parallel to the surface 407. For reference purposes herein, a "substantially horizontal" orientation includes an orientation wherein the long axis A of a topological insulator tube forms an angle ($\theta 1$) of less than about 45 degrees with a line A parallel to the surface 407 of the substrate layer 403. In some implementations, the angle ($\theta 1$) is less than about 30 degrees or less than about 15 degrees. In some implementations, the angle (θ1) is between about 0 degrees and about 30 degrees. In some implementations, a majority of the topological insulator tubes of a topological insulator layer described herein have a horizontal or substantially horizontal orientation. Further, in some implementations, at least about 60 percent, at least about 70 percent, at least about 80 percent, or at least about 90 percent, of the topological insulator tubes of a topological insulator layer have a horizontal or substantially horizontal orientation.

Figure 5:
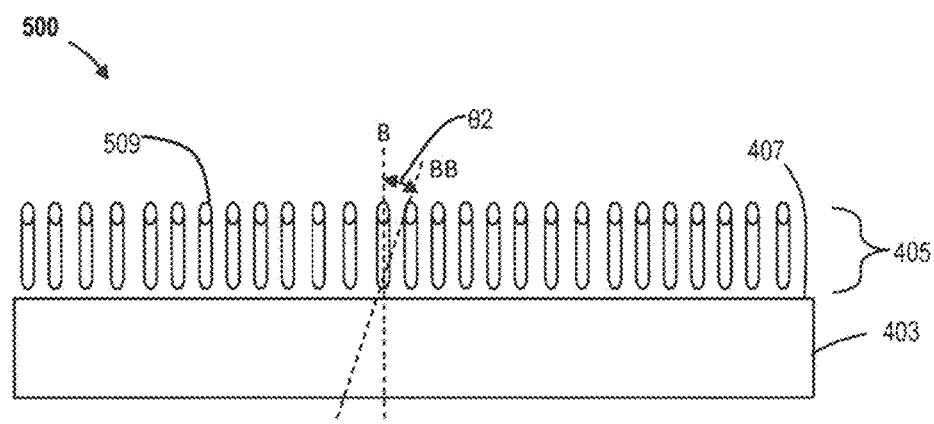
FIG. 5 shows a cross sectional view illustrating an example of an electrically conductive layer in accordance with aspects of the present disclosure.

FIG. 5 illustrates a cross sectional view of an electrically conductive layer 500 for a touch screen sensor in accordance with aspects of the present disclosure. The electrically conductive layer 500 is similar to that described above with regard to FIG. 4. However, FIG. 5 depicts an implementation, in which topological insulator tubes 509 of a 3D topological insulator layer 405 are oriented vertically or substantially vertically. In some implementations, the vertical topological insulator layer tubes 509 can be used to provide a surface capacitive touch screen sensor. More specifically, the electrically conductive layer 500 can include a substrate layer 403 and a topological insulator layer 405, which are similar to those previously described. The vertical topological insulator tubes 509 oriented vertically or substantially vertically on the surface 407 of the substrate layer 403. Vertical orientation is relative to the surface 407. For reference purposes herein, a "vertical orientation" includes an orientation wherein the long axis B of a topological insulator tube 509 is oriented perpendicular to the surface 407. As depicted in FIG. 5, all of the topological insulator tubes 509 are depicted as being oriented along axis B. However, it is understood that the topological insulator tubes can be provided in other arrangements. For example, in some implementations, one or more topological insulator tubes 509 can have a long axis along line BB or along some other direction that is not parallel to the surface 407. A "substantially vertical" orientation, for reference purposes herein, includes an orientation wherein the long axis BB of a topological insulator tube 509 forms an angle (θ2) of less than about 45 degrees with an axis B perpendicular to the surface of the substrate layer 403. In some implementations, the angle (θ2) is less than about 30 degrees or less than about 15 degrees, in some implementations, the angle (θ2) is between about 0 degrees and about 30 degrees. In some implementations, a majority of the topological insulator tubes of a topological insulator layer described herein have a vertical or substantially vertical orientation. Further, in some implementations described herein, at least about 60 percent, at least about 70 percent, at least about 80 percent, or at least about 90 percent of the topological insulator tubes of a topological insulator layer have a vertical or substantially vertical orientation. There are different component geometries and different types of packaging that can benefit from different alignments of the nanotubes. These can vary depending upon the tradeoffs between geometries and physical properties. For example, if the nanotubes are absolutely vertical, they can provide strong insulator or resistive strength in the vertical direction. But that can potentially cause packaging problems, with the layer being too thick. Tilting the layer slightly away from vertical can maintain the electrical properties, albeit to a lesser extent, while reducing the overall volume of the nanotube structure.

The benefit or technical effect of using topological insulator nanotubes can be that the topological insulator nanotubes have more variability than graphene. More particularly, the topological insulator nanotubes can have a different geometry than, for example, graphene, allowing the topological insulator layer to take on different shapes and be applied to different surfaces than a graphene layer. Moreover, the dielectric properties of the topological insulator nanotubes (e.g., resistance and insulative properties) can be specifically tailored, whereas the same properties cannot be tailored in a graphene layer. In addition, the diameter, thickness, and angle of adhesion of the topological insulator nanotubes can be modified, whereas the same properties of a graphene layer cannot be modified (i.e., they are set). The modifications can include different geometrical properties or dopants that are added. Furthermore, the manufacturing of the topological insulator layer can be easier than a coating layer. For example, when using a CVD process, a hydrogen atmosphere may be necessary to maintained to produce a graphene layer, but no such hydrogen atmosphere is necessary to produce the topological insulator layer.

Figure 6:
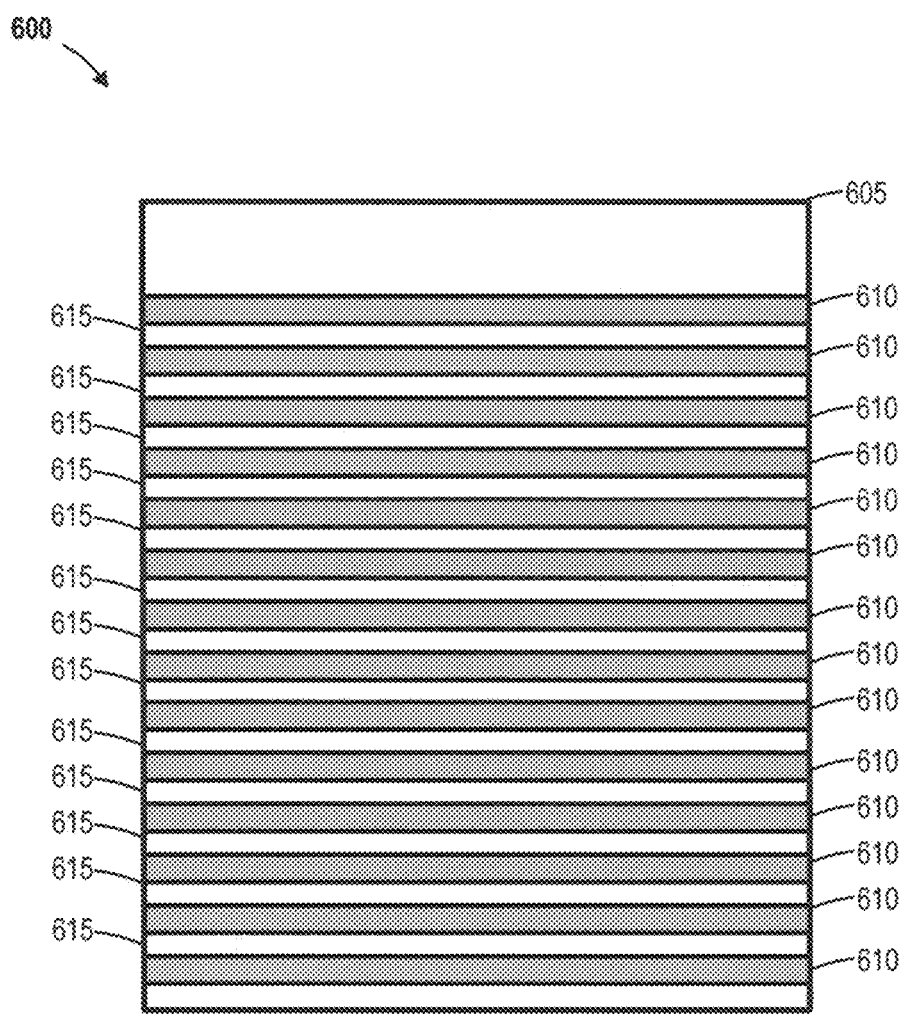
FIG. 6 shows a plan view illustrating an example of a touch screen in accordance with aspects of the present disclosure.

FIG. 6 illustrates a plan view of a touch screen sensor 600 according to aspects of the present disclosure. The touch screen sensor 600 can be similar to those previously described herein (e.g., touch sensor layer 115). The touch screen sensor 600 can include an electrically non-conductive layer 605 (e.g., substrate layer 403). In the present implementation, the electrically non-conductive layer 605 includes a number of parallel strips (e.g., lines) of 3D topological insulator 610 that provide conductive lines for, e.g., communicating electrical signals representing touch inputs. In addition, the strips of 3D topological insulator 610 can be electrically isolated from each other by dielectric material 615. The electrically insulating material 615 can be, for example, a dielectric material, such as adhesive, air, or some other material. Further, the strips of 3D topological insulator 610 can be connected to one or more electrodes (e.g., electrodes 220X or 220Y) or to one or more signal lines (e.g., signal lines 125X and 125Y) for communicating touch inputs to a controller (e.g., controller 105). Moreover, one or more of the strips of 3D topological insulator 610 can be a layer of topological insulator nanotubes described herein, including but not limited to a layer pf topological insulator nanotubes as previously described herein (e.g., tubes 409 and 509). nanotubes as previously describe herein (e.g., tubes 409 and 509).

In implementations, an electrically non-conductive layer 605, strips of 3D topological insulator 610, and dielectric material 615 can be used to provide a multi-touch touch screen display device. For example, first "copy" of the electrically non-conductive layer 605, strips of 3D topological insulator 610, and dielectric material 615 of FIG. 6 can be used as the layer of a touch screen sensor, and a second "copy" of such layers can be used as the second of the touch screen sensor. Further, the second copy can be rotated by 90 degrees. In this manner, a substantially perpendicular (X-Y) grid of strips of topological insulator 610 separated by a spacer layer (e.g., spacer layer 315) can be formed, as shown in FIG. 3. As understood by one of ordinary skill in the art, such a structure or architecture can provide a multi-touch resistive touch screen that is responsive to multiple simultaneous touches, since multiple X-Y coordinates can be simultaneously touched and resistively sensed by the touch screen.

Figure 7:
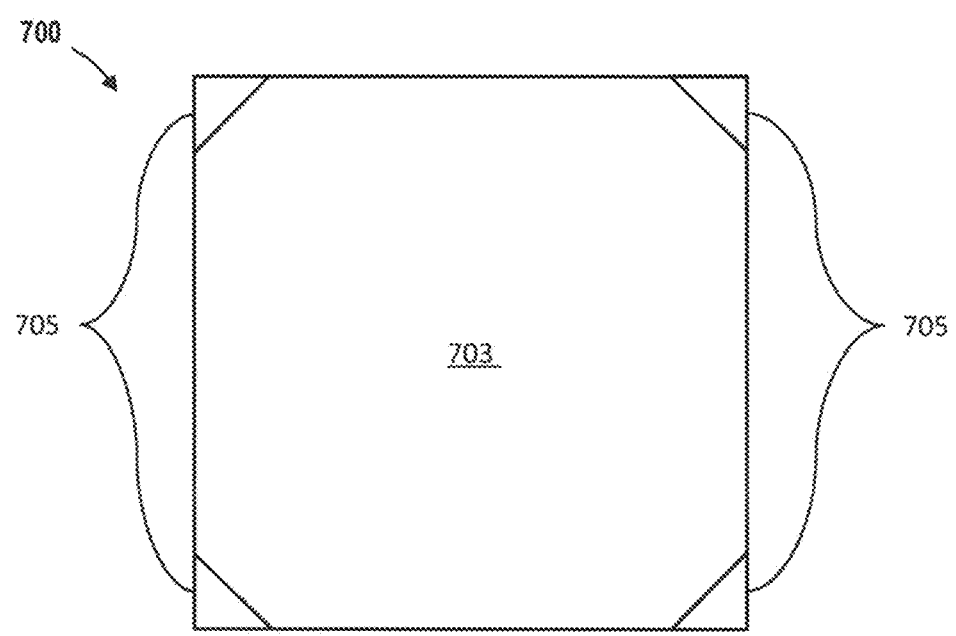
FIG. 7 shows a plan view of a touch screen in accordance with aspects of the present disclosure.

FIG. 7 illustrates a plan view of a touch screen sensor 700 in accordance with aspects of the present disclosure. The touch screen sensor 700 can be similar to those previously described herein (e.g., touch sensor layer 115). In implementations, the touch screen sensor 700 has a substantially rectangular shape and four electrodes 705 are disposed in the four corners of the touch screen sensor 703. A touch screen sensor 700 having such an electrode structure, in some implementations, can operate as a capacitive touch screen such as a surface capacitive touch screen.

Figure 8:
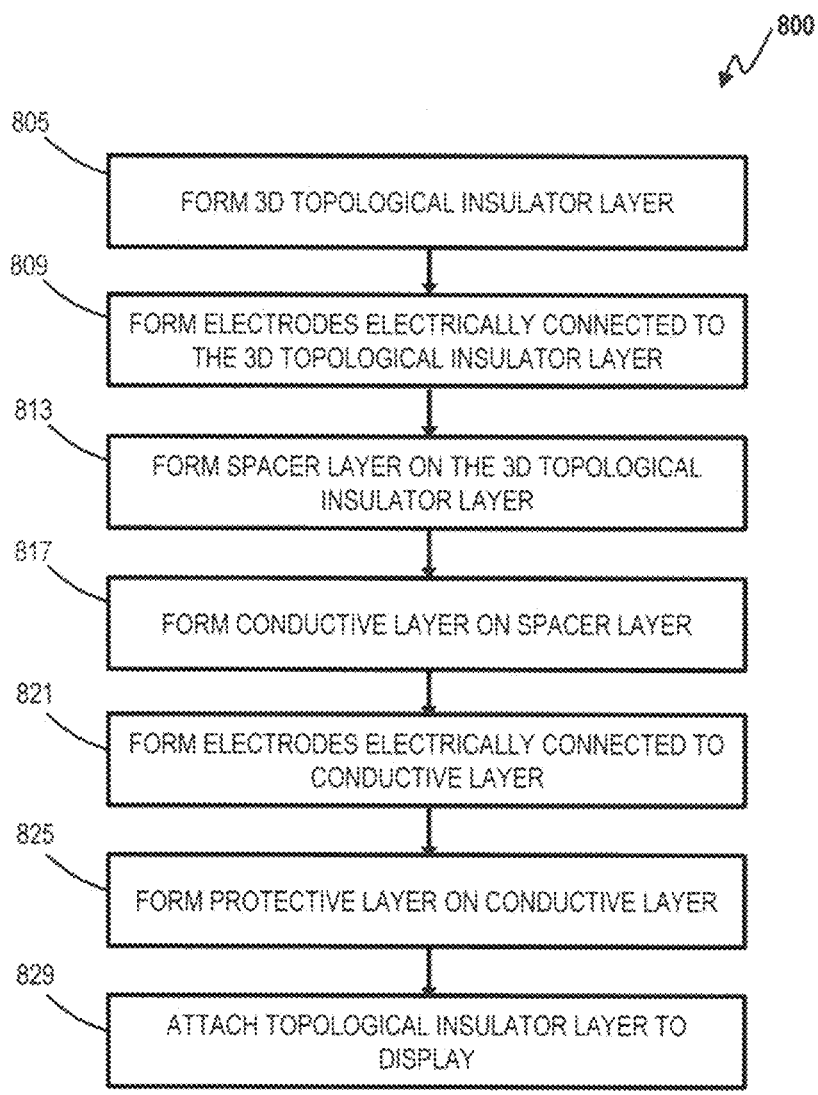
FIG. 8 shows a flow block diagram illustrating an example of a process forming a touch screen display device in accordance with aspects of the present disclosure.

FIG. 8 illustrates a flow block diagram of a process 800 for forming a touch screen sensor (e.g., touch sensor layer 115) in accordance with aspects of the present disclosure. At 805, a 3D topological insulator layer is formed. The 3D topological insulator layer can be the same or similar to that previously described herein. In some implementations, the 3D topological insulator layer is formed as a single bulk layer comprised solely of topological insulator material. In some implementations, the 3D topological insulator layer can be doped after formation.

The 3D topological insulator layer can be formed in using a variety of existing fabrication techniques. For example, topological insulator layer formation can be carried out by vapor deposition on a substrate or laser ablation. In some implementations, forming the 3D topological insulator layer includes forming a layer of topological insulator tubes disposed on a substrate. (See, e.g., FIGS. 4 and 5.) In some implementations, the topological insulator tubes are horizontally or substantially horizontally oriented. In some implementations, forming the topological insulator layer includes forming one or more strips of topological insulator (e.g., strips of topological insulator 610 in FIG. 6). For instance, in some implementations, laser ablation can be used to remove or ablate thin strips of topological insulator, leaving behind strips of exposed substrate between strips of topological insulator layers, such that each strip or line of topological insulator is electrically isolated from the other strips of topological insulator. Alternatively, an etching and masking technique may be used if desired.

At 809, one or more electrodes are electrically connected to the 3D topological insulator layer formed at 805. The electrodes layer can be the same or similar to that previously described (e.g., electrodes 220X and 220Y). The electrodes can be formed so as to connect to an outermost surface of the topological insulator layer. For example, the electrodes can conduct electricity from the conductive surface of the topological insulator so as to maintain an electric charge between its outermost surfaces (e.g. non-conductive layers 205 and 210). In some implementations, four corner electrodes (e.g., electrodes 705) are provided and electrically connected as previously described. In other implementations, a network, mesh, or grid of electrodes is provided and electrically connected to one or more electrically conductive layers described herein to provide a touch screen having a PCT touch screen structure. As understood by those of ordinary skill in the art, other electrode configurations may also be used.

At 813, a spacer layer can be formed on the 3D topological insulator layer formed at 809. The spacer layer can be the same or similar to that previously described (e.g., spacer layer 315). In some implementations, for instance, the spacer layer can an array of flexible or compressible microdots is used to separate a first conductive layer from a second conductive layer such that deformation of the first conductive layer by a user can provide contact between the first and second conductive layers, thereby providing sensitivity of the touch screen to user input. In other implementations, the spacer layer can be a bulk layer of dielectric material.

At 817, a conductive layer can be formed on the spacer layer formed at 813. In accordance with implementations of the present disclosure, the conductive layer can be formed from topological insulator material using the same techniques detailed above with regard to 805. In other implementations, the conductive layer formed at 817 can be formed from a transparent conductive film, as previously described. At 821, one or more electrodes are formed so as to electrically connect to the conductive layer formed at 817, as previously described.

At 825, a protective layer can be formed on the conductive layer formed at 817 and/or the electrodes formed at 821. The protective layer can be the same or similar to that previously described (e.g., protective layer 120). In implementations, the protective layer can be attached to the conductive layer formed at 817 on using one or more of heat, vacuum, and pressure techniques.

At 829, the 3D topological insulator layer formed at 805 can be attached to a display (e.g., display layer 110). In implementations, the display layer can be attached to the topological insulator layer using one or more of heat, vacuum, and pressure techniques.

The flow diagram in FIG. 8 illustrates an example of the operation of possible implementations of a method according to various implementations consistent with the present disclosure. Each block in the flow diagram can occur out of the order shown in FIG. 8. For example, two blocks shown in succession can be executed substantially concurrently, or the blocks can sometimes be executed in the reverse order, depending upon the functionality involved.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing examples of implementations, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more " to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

The invention claimed is:

1. A touch screen device comprising:
   a touch sensor layer comprising a 3D topological insulator configured to maintain an electric charge over opposing outer surfaces of the 3D topological insulator, wherein the 3D topological insulator comprises a single layer of doped bulk material and has a thickness greater than 10 nm and the single layer of doped bulk material of the 3D topological insulator has an optical transparency of at least about 90 percent between wavelengths of about 350 nanometers ("nm") and about 750 nm;
   electrodes electrically connected to opposing outer surfaces of the 3D topological insulator; and
   a controller configured to determine a position at which an object touches the touch screen device based on a change in the electric charge over the opposing outer surfaces of the 3D topological insulator.

2. The touch screen device of claim 1, wherein the 3D topological insulator is devoid of carbon, graphene, or both carbon and graphene.

3. The touch screen device of claim 1, wherein an outermost surface of the touch sensor layer lacks an electrically conductive coating over the opposing outer surfaces of the 3D topological insulator.

4. The touch screen device of claim 1 further comprising:
   a spacer layer on the touch sensor layer; and
   an electrically conductive layer on the spacer layer.

5. The touch screen device of claim 4, wherein the electrically conductive layer comprises a topological insulator layer.

6. The touch screen device of claim 1, further comprising a protective layer on one of the opposing outer surfaces of the 3D topological insulator.

7. The touch screen device of claim 1, wherein the 3D topological insulator comprises at least one of: Sb, Bi2Se3, Bi2Te3, BiSb2, Bi2Se3, HgTe, and CdTe.

8. The touch screen device of claim 1, wherein at least one of the opposing outer surfaces of the 3D topological insulator are patterned as a grid having lines isolated by dielectric material.

9. The touch screen device of claim 1, wherein the 3D topological insulator comprises a layer of tubular topological insulator tubes.

10. A method of making a touch screen device comprising:
    forming a 3D topological insulator layer, the 3D topological insulator layer comprising a first electrically conductive surface, an second electrically conductive surface, and a dielectric interior, wherein the 3D topological insulator comprises a single layer of doped bulk material and has a thickness greater than 10 nm the single layer of doped bulk material of the 3D topological insulator has an optical transparency of at least about 90 percent between wavelengths of about 350 nanometers ("nm") and about 750 nm; and
    electrically connecting first electrodes to the first electrically conductive surface.

11. The method of claim 10, wherein the 3D topological insulator layer is devoid of carbon, graphene, or both carbon and graphene.

12. The method of claim 10, further comprising:
    forming a spacer layer on the 3D topological insulator layer;
    forming an electrically conductive layer on the spacer layer; and
    electrically connecting second electrodes to the electrically conductive layer.

13. The method of claim 12, wherein forming the electrically conductive layer comprises:
    forming a second 3D topological insulator layer on the spacer layer; and
    electrically connecting the second electrodes comprises electrically connecting the second electrodes to the second 3D topological insulator layer.

14. The method of claim 10, wherein forming the 3D topological insulator layer comprises forming a plurality of topological insulator tubes on a substrate.

15. The method of claim 12, further comprising:
    forming a protective layer on the 3D topological insulator layer; and
    attaching the 3D topological insulator layer to a display.

* * * * *